United States Patent
Song

[11] Patent Number: 6,081,148
[45] Date of Patent: Jun. 27, 2000

[54] APPARATUS FOR MINIMIZING A CLOCK SKEW OCCURRING IN A SEMICONDUCTOR DEVICE

[75] Inventor: Yoon Seok Song, Kyoungki-do, Rep. of Korea

[73] Assignee: Hyundai Electronics Industries Co., Ltd., Ichon, Rep. of Korea

[21] Appl. No.: 09/104,541

[22] Filed: Jun. 26, 1998

[30] Foreign Application Priority Data

Jun. 26, 1997 [KR] Rep. of Korea ............... 97-27898

[51] Int. Cl.[7] ............................................. H03K 5/14
[52] U.S. Cl. .......................... 327/292; 327/293; 327/295
[58] Field of Search .................................. 327/291, 292, 327/293, 295; 713/401, 503

[56] References Cited

U.S. PATENT DOCUMENTS 5,369,640  11/1994  Watson et al. ..................... 327/292
5,686,845  11/1997  Erdal et al. ......................... 326/93
5,784,600  7/1998  Doreswamy et al. ............... 713/503

FOREIGN PATENT DOCUMENTS 59-105123  6/1984  Japan .

Primary Examiner—Tuan T. Lam
Attorney, Agent, or Firm—Jacobson, Price, Holman & Stern, PLLC

[57] ABSTRACT

A clock circuit is used in a semiconductor device having a control block and a macroblock in order to provide synchronous clocks. The clock circuit contains a clock source for generating the clocks; a clock tree, coupled between the clock source and the control block and the macroblock, for relaying the clocks to the control block and the macrobock; and programmable delays coupled between the clock source and the clock tree and between the clock tree and the control block and the macroblock in order to reduce overall clock skew.

14 Claims, 4 Drawing Sheets

APPARATUS FOR MINIMIZING A CLOCK SKEW OCCURRING IN A SEMICONDUCTOR DEVICE

FIELD OF THE INVENTION

The present invention relates to a clock circuit for used in a semiconductor chip; and, more particularly, to a clock circuit which is capable of effectively providing clock signals to elements contained in a semiconductor device with a minimized clock skew.

DESCRIPTION OF THE PRIOR ART

A semiconductor device is generally provided with synchronized circuit elements, e.g., latches, to a clock signal and, in order to implement various functions therein, is designed by employing previously optimized various macroblocks. In this case, when a conventional clock circuit is employed in the semiconductor device, desired functions may not preferably be implemented due to a clock skew. Especially, when previously constructed blocks such as the macroblocks is designed to be contained in the semiconductor device, it is difficult to deal with a problem of overall clock skew since each of the macroblocks inherently has a predetermined clock tree and various internal clock delay elements.

Referring to FIG. 1, there is shown a conventional clock circuit of the semiconductor device. As shown, the clock circuit includes single clock source 1, m number of control block latches (as generally designated as 2), n number of macroblocks (as generally designated as 3) and a clock tree, wherein m and n are positive integers. The clock tree is coupled between the single clock source and, the control block latches and the macroblocks. When the internal clock delay of each of the macroblocks is reflected in the design of the clock tree, some of the macroblocks can be connected with an intermediate stage of the clock tree. In this case, the overall clock skew thereof is determined as a followed relationship. First, a greatest delay for the control block latches is represented by $CT_{max}=MAX(CT1, CT2, \ldots, CTm)$ and a shortest delay therefor is designated by $CT_{min}=MIN(CT1, CT2, \ldots, CTm)$, wherein CTi is a clock tree delay for an ith latch. A greatest delay for the macroblocks is denoted by $M_{max}=MAX(M1, M2, \ldots, Mn)$ and a smallest delay therefor is expressed by $M_{min}=MIN(M1, M2, \ldots, Mn)$. A clock delay for an ith macro Mi is a sum of a clock tree delay Ti and an internal delay MIi which is represented by Mi=Ti+MIi. Therefore, the overall clock skew can be denoted by $MAX(CT_{max}, M_{max})-MIN(CT_{min}, M_{min})$. If the overall clock skew falls in a skew tolerance predetermined in a design specification, there is no clock skew problem in the semiconductor device. If not, it should be needed to adjust the overall clock skew in order to meet the predetermined tolerance. However, since, in order to correct the overall clock skew, a portion of the clock tree is modified so that the remaining portions thereof are also varied according thereto, it is actually difficult to partially correct the clock tree contained in the clock circuit.

Furthermore, in order to design the desired clock tree, an exact overall clock skew should be estimated. However, since the delay may be affected by capacitances and resistances determined the geometrical structure or relationship between cells or metal wires contained in the semiconductor device. It is difficult to exactly estimate or extract those parameters in order to implement the desired clock tree contained in the clock circuit.

SUMMARY OF THE INVENTION

It is, therefore, an object of the invention to provide a clock circuit which is capable of effectively providing clock signals to elements contained in a semiconductor device with a minimized clock skew a more increased cell density.

In accordance with the present invention, there is provided a clock circuit, for use in a semiconductor device having a control block and a macroblock, for providing synchronous clocks the control block and the macroblock, wherein the control block has a number of latches and the macroblock has a plurality of macros, comprising: a clock source for generating the clocks; a clock tree, coupled between the clock source and the control block and the macroblock, for relaying the clocks to the control block and the macrobock; and programmable delays coupled between the clock source and the clock tree and between the clock tree and the control block and the macroblock in order to reduce overall clock skew.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

In accordance with the present invention, a clock circuit is first designed by using a conventionally determined clock tree and the overall clock skew is then estimated. Thereafter, based on the estimated result, the overall clock can be easily modified by using newly added delay blocks. That is, in order to effectively correct the overall clock skew, the clock circuit includes a clock tree for the control block and a clock tree for the macroblock which are independently designed and contains a plurality of programmable delay blocks, each having a number of unit delay elements. Especially, the programmable delay block can be coupled between a clock source and each of the clock tree and between each of the clock tree and the control block latches or the macroblocks in order to effectively correct the overall clock skew.

Figure 1:
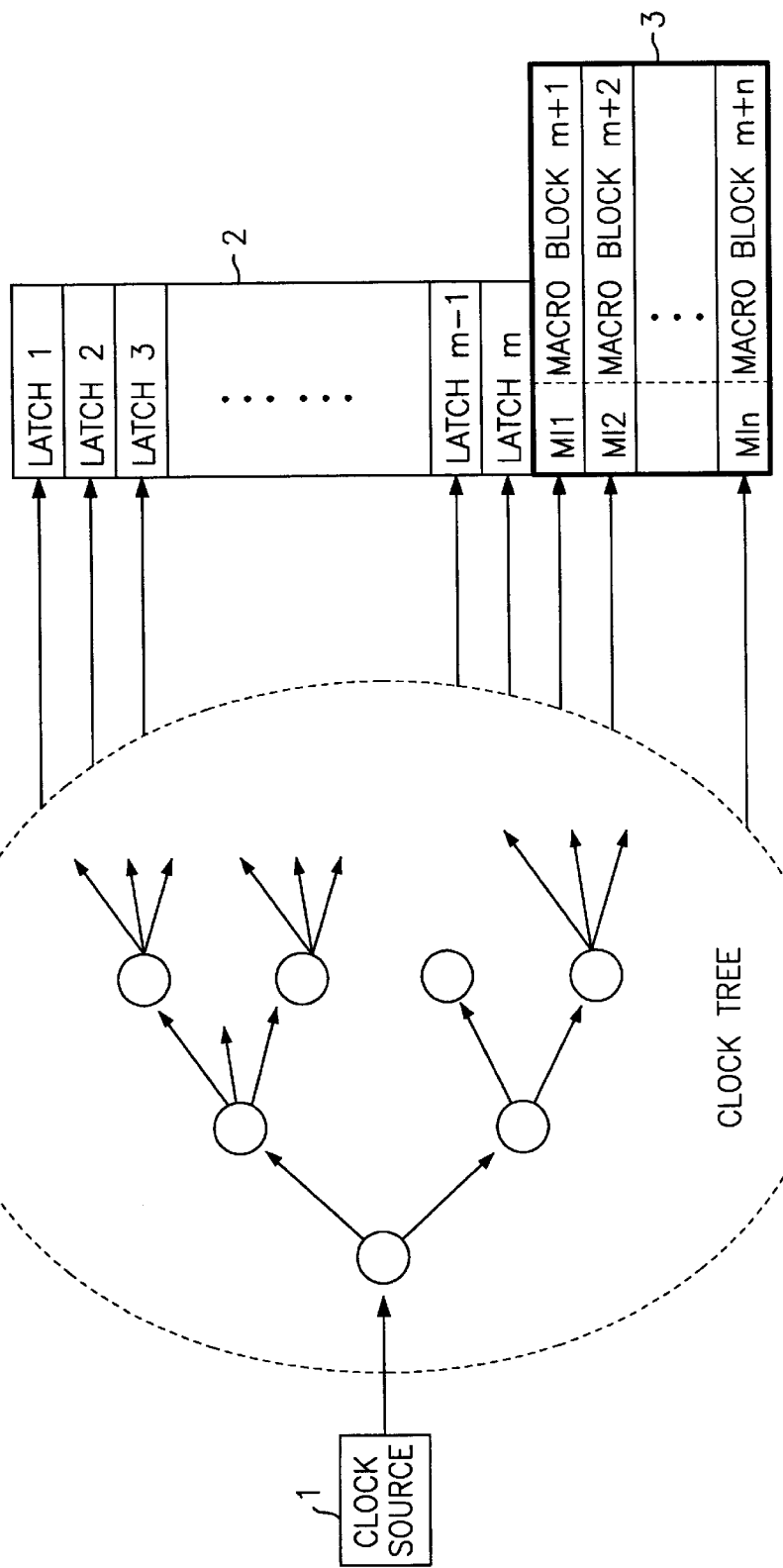
FIG. 1 shows a schematic diagram of a conventional clock circuit contained in a semiconductor device.
Figure 2:
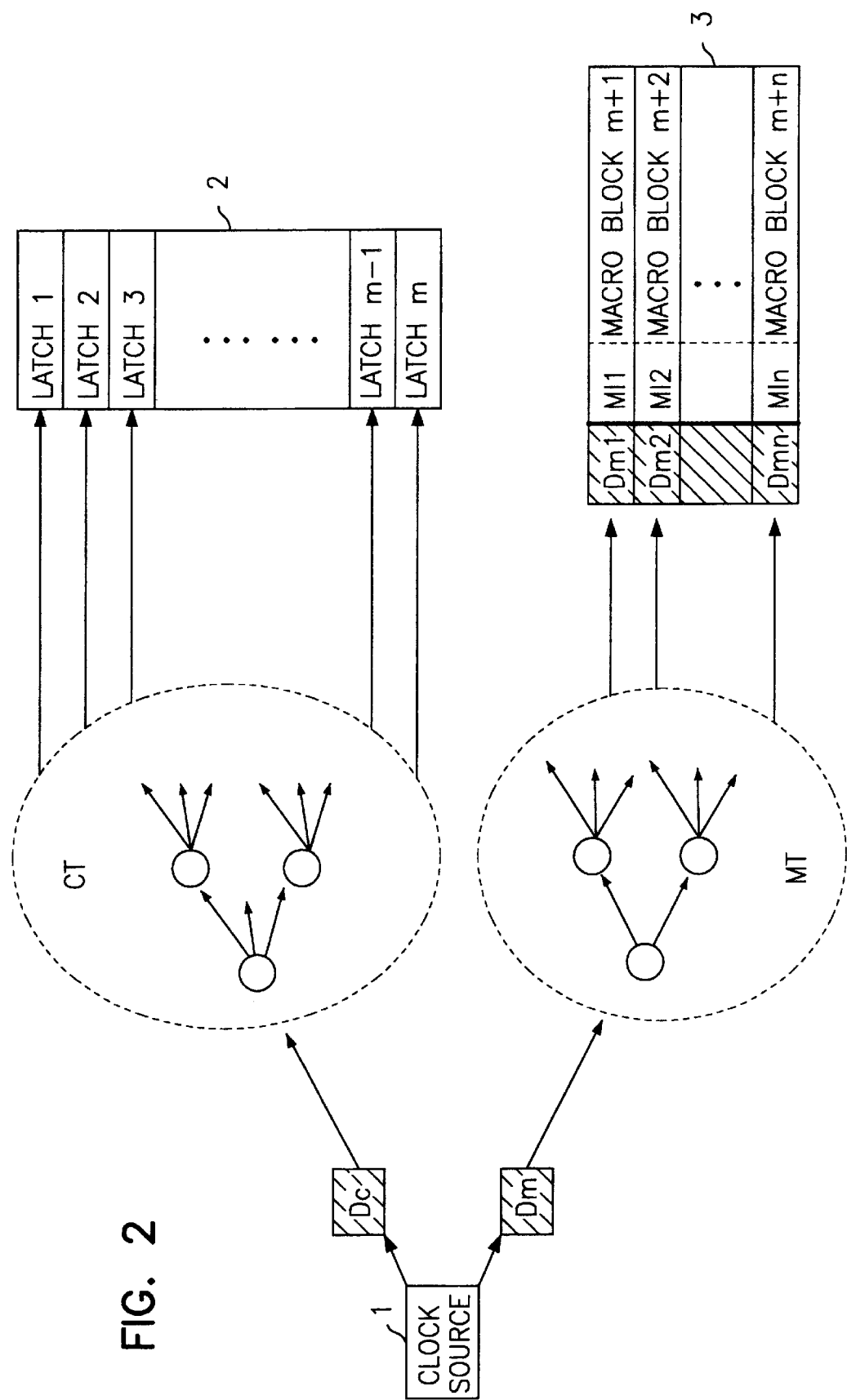
FIG. 2 discloses a diagram of a clock circuit in accordance with the present invention.

Referring to FIG. 2, there is shown a clock circuit in accordance with the present invention. As shown, the clock circuit includes a clock source 1, two clock trees CT and MT and a plurality of delay blocks. The clock trees are designed to be coupled to a group of the control block latches and another group of the macros, respectively. That is, the control block latches are connected to the last stage of the clock tree and a different clock tree is employed in the macroblock since there are different delay elements, e.g., MIi, in the macros. Therefore, the better result can be obtained and a delay correction can be easily obtained thereby.

Figure 3:
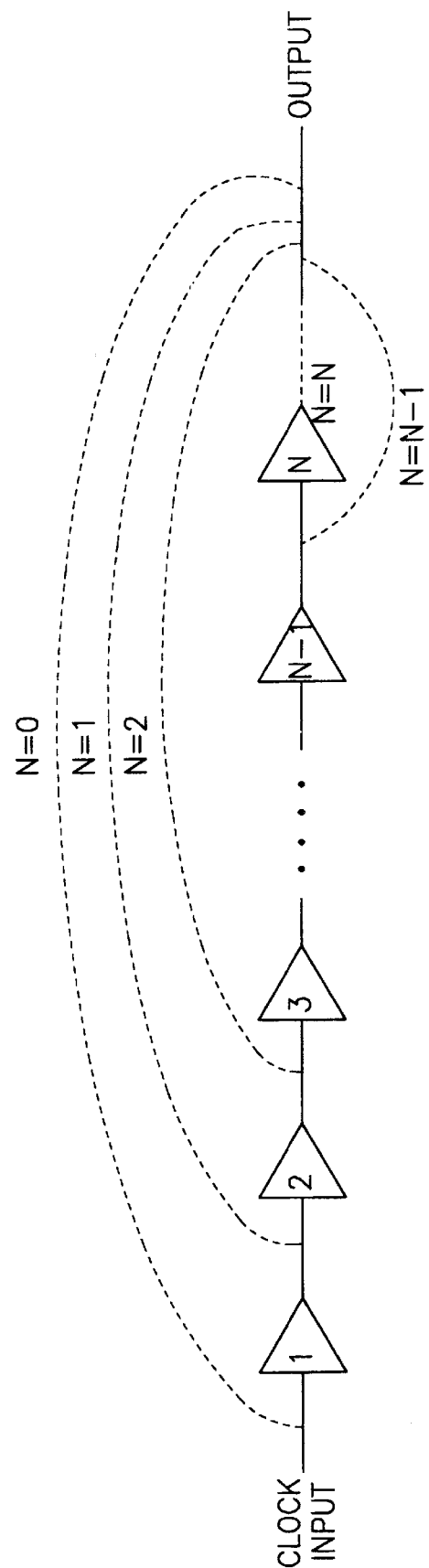
FIG. 3 describes a diagram of a delay block contained in the clock circuit shown in FIG. 1.
Figure 4:
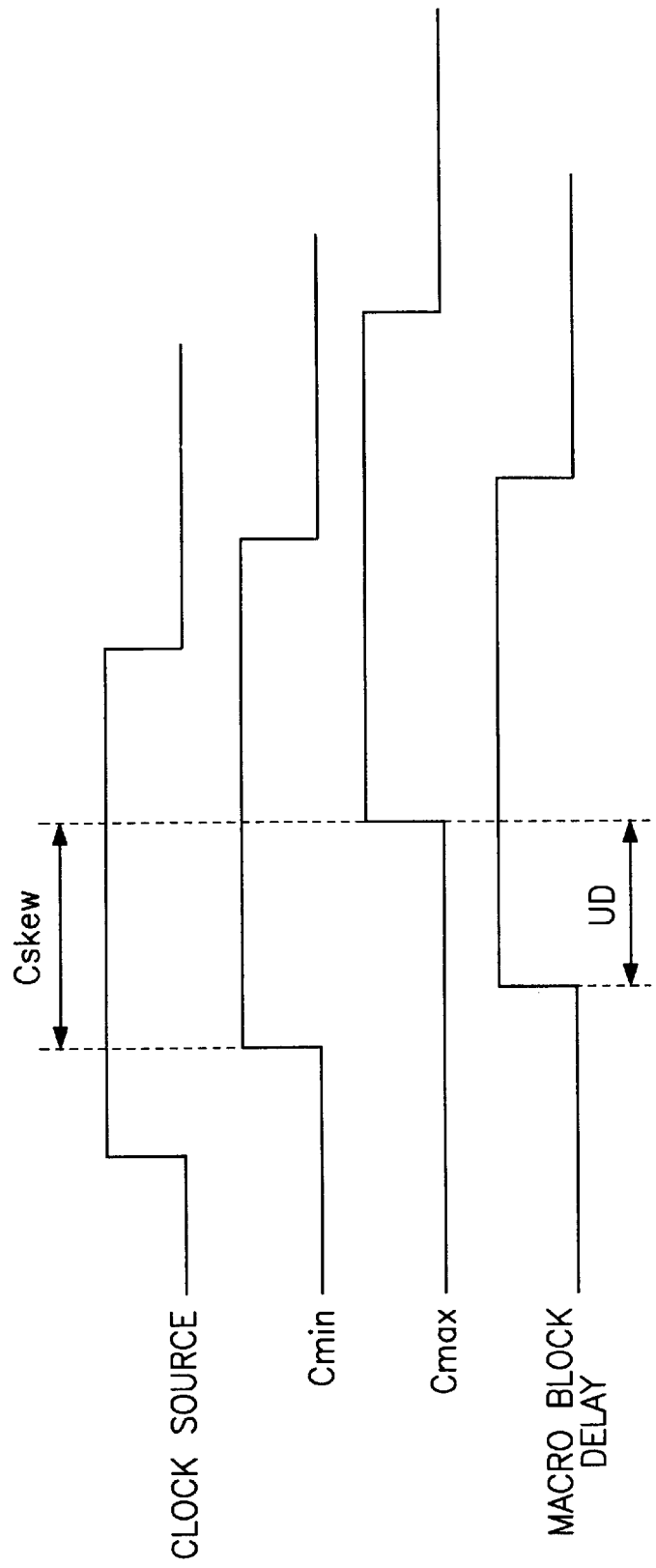
FIG. 4 illustrates a timing diagram representing a unit delay extracted from a relationship between the delay of the control block and the delay of the macroblocks.

Referring to FIG. 3, there is depicted a detailed diagram of the delay block. The delay block includes N number of buffers each of which has a unit delay UD, N being 0 or a positive integer. The buffers are connected each other in a series fashion and the number of the buffers can be programmably determined according to the desired unit delays.

The number of the desired unit delays is N, wherein N is 0 or a positive integer. In accordance with the present invention, when the correction to the overall clock skew is accomplished, any redundant unit delays can be removed from the delay block and the number of the unit delays can be permanently fixed.

The delay blocks Dc and Dm, which are connected to the inputs of the clock trees CT and MT, respectively, serve to correct the clock skew between the clock trees CT and MT. That is, the delay block having some delay elements is connected to the input of the clock tree CT or MT having a smaller delay than that of the other. The delay block having no delay, e.g., "0" is connected to the clock tree CT or MT having a larger delay than that of the other. On the other hand, each of the delay blocks connected to a corresponding macro serves to correct or complement a clock skew due to the internal delay elements of each of the macros.

Referring to FIG. 2 and 3, detailedly described hereinafter is the method, in accordance with the present invention, for analyzing or estimating the overall clock skew and for complementing or correcting the clock skew by using the delay blocks Dc, Dm and Dmi. In this case, the clock skew occurring in the clock circuit having only two clock trees is first analyzed or estimated.

In an estimation from a first clock path, i.e., the control clock tree CT, the greatest delay $CT_{max}$ thereof is represented by $CT_{max}$=MAX(CT1, CT2, . . . , CTm), wherein m denotes the number of the latches or flip-flops contained in the control block 2 and CTi is a delay from the control block tree CT to ith latch. On the other hand, the smaller delay $CT_{min}$ hereof is expressed by $CT_{min}$=MIN(CT1, CT2, . . . , CTm). Therefore, the clock skew thereof can be represented by $C_{skew}=CT_{max}-CT_{min}$.

Next, in an estimation from a second clock path, i.e., the macro clock tree MT, the clock delay thereof includes a delay of the macro clock tree MT and an internal delay of the macro so that the delay Mi of ith macroblocks can be represented by Mi=MTi+MIi, wherein MTi is a delay from the macro clock tree MT to the ith macroblocks and MIi is an internal delay of the ith macro. The greatest delay $M_{max}$ thereof is represented by $M_{max}$=MAX(M1, M2, . . . , Mm). On the other hand, the smaller delay $M_{min}$ hereof is expressed by $M_{min}$=MIN (M, M2, . . . , Mm). Therefore, the clock skew thereof can be represented by $M_{skew}=M_{max}-M_{min}$.

Assuming that there is no delay block, the overall clock skew $T_{skew}$ can be represented by $T_{skew}$=MAX($CT_{max}$, $M_{max}$)−MAX($CT_{min}$, $M_{min}$). In this case, since it is difficult to reflect the delay of the macroblock in the circuit design, the overall clock skew is increased by $M_{max}$ or $M_{min}$.

In accordance with the present invention, the overall clock skew can be minimized and the effect of the clock skew of the macro skew can be also minimized by using the delay blocks Dc, Dm and Dmi. In this case, the relationship between the clock skew $C_{skew}$ of the control block 2 and the unit delay UD of the delay block should be considered in the design scheme. That is, if the clock skew $C_{skew}$ is smaller than the unit delay UD, the overall skew is determined by the unit delay. While, if the unit delay is smaller than the clock skew $C_{skew}$, the overall clock skew is determined by the clock skew $C_{skew}$ and a clock skew of the delay block does not affect to the overall clock skew. Although the overall skew is determined by the unit delay, the unit delay is selected in the range of the tolerance of the overall clock skew so that the clock skew of the macroblocks does not exceed the tolerance of the overall clock skew.

In this case, the sake of the convenience, it is assumed that the clock skew of the control block $C_{skew}$ is in the tolerance of the overall clock skew. The delay is determined when $CT_{max} \geq M_{max}$, as follows:

$C_{max}=CT_{max}$

Dc=0 and Dm=UD*N, wherein N is an integer and is satisfied by the condition that UD*N+$M_{max}$≤$C_{max}$<UD*(N+1)+$M_{max}$.

Dmi=UD*Ni, wherein I=0, . . . , n;n is the number of the macroblocks; and Ni is an integer and is satisfied by the condition that Dm+Mi+UD*Ni≤$C_{max}$<Dm+Mi+UD*(Ni+1).

First, when the greatest clock delay $CT_{max}$ of the control block is greater than that $M_{max}$ of the macroblock, as can be seen from the above Eq., a maximum delay $C_{max}$ becomes identical to the greatest clock delay $CT_{max}$ and the delay block Dc becomes "0". The delay block Dm becomes N times of the unit delay UD, wherein N is an integer and is determined by satisfying the condition that the maximum delay $C_{max}$ is greater than or identical to the delay obtained by adding N times of the unit delay UD to the greatest delay of the macroblock $M_{max}$ and is smaller than the delay obtained by adding (N+1) times of the unit delay UD to the greatest delay of the macroblock $M_{max}$. The delay block Dmi connected to the input of corresponding macro, becomes Ni times of the unit delay UD, wherein Ni is an integer and is determined by satisfying the condition that the maximum delay $C_{max}$ is greater than or identical to the delay obtained by adding Ni times of the unit delay UD and the delay of the delay block Dm to the internal delay of the macro Mi and is smaller than the delay obtained by adding (Ni+1) times of the unit delay UD and the delay of the delay block Dm to the internal delay of the macro Mi.

The delay is determined when $CT_{max}<M_{max}$, as follows:

Dc=UD*N wherein N is an integer and is satisfied by the condition that UD*(N−1)+$CT_{max}$<$M_{max}$≤UD*N+$CT_{max}$.

$C_{max}$=UD*N+$CT_{max}$

Dm=0

Dmi=UD*Ni, wherein I=0, . . . , n;n is the number of the macros; and Ni is an integer and is satisfied by the condition that Mi+UD*Ni≤$C_{max}$<Mi+UD*(Ni+1).

When the greatest clock delay $CT_{max}$ of the control block is smaller than that $M_{max}$ of the macroblock, as can be seen from the above Eq., the delay of the delay block Dc becomes identical to N times of the unit delay UD, wherein N is an integer and is determined by satisfying the condition that the greatest clock delay $M_{max}$ is greater than the delay obtained by adding (N−1) times of the unit delay UD to the greatest delay of the control block $CT_{max}$ and is smaller than or identical to the delay obtained by adding N times of the unit delay UD to the greatest delay of the control block $M_{max}$. The maximum delay $C_{max}$ becomes identical to the delay obtained by adding N times of the unit delay UD to the greatest delay of the control block $CT_{max}$ and the delay of the delay block Dmi becomes "0". The delay block Dmi connected to the input of corresponding macroblocks, becomes Ni times of the unit delay UD, wherein Ni is an integer and is determined by satisfying the condition that the maximum delay $C_{max}$ is greater than or identical to the delay obtained by adding Ni times of the unit delay UD to the internal delay of the macro block Mi and is smaller than the delay obtained by adding (Ni+1) times of the unit delay UD to the internal delay of the macros Mi.

When the number of the unit delays obtained from the above Equations is implemented in the delay blocks, the clock delay corresponding to each of the macros is smaller than or identical to the maximum delay $C_{max}$. In this case, the difference between the clock delay and the maximum delay $C_{max}$ is in range from 0 to the unit delay UD. Therefore, when the unit delay UD is smaller than the control block clock skew $C_{skew}$, the design for the overall clock skew is affected by the macroblock, while, otherwise, the unit delay UD becomes the overall clock skew.

As can be seen from the above, in accordance with the present invention, the inventive clock circuit is first designed by using a conventionally determined clock tree and the overall clock skew is then estimated. Thereafter, based on the estimated result, the overall clock can be easily modified by using newly added delay blocks. Consequently, in order to effectively correct the overall clock skew, the inventive clock circuit includes a clock tree for the control block and a clock tree for the macroblocks which are independently designed and contains a plurality of programmable delay blocks, each having a number of unit delay elements. Especially, the programmable delay block can be coupled between a clock source and each of the clock tree and between each of the clock tree and the control block latches or the macroblocks in order to effectively correct the overall clock skew.

While the present invention has been shown and described with reference to the particular embodiments, it will be apparent to those skilled in the art that many changes and modifications may be made without departing from the spirit and scope of the invention as defined in the appended claims.

What is claimed is:

1. A clock circuit, for use in a semiconductor device having a control block and a macroblock, for providing clocks to the control block and the macroblock, wherein the control block has a number of latches and the macroblock has a plurality of macros, comprising:

a clock source for generating the clocks;

a clock tree, coupled between the clock source and the control block and the macroblock, for relaying the clocks to the control block and the macrobock; and programmable delays coupled between the clock source and the clock tree in order to reduce overall clock skew.

2. The clock circuit as recited in claim 1, wherein the clock tree includes:

a first clock tree coupled between the clock source and the control block; and a second clock tree coupled between the clock source and the macroblock.

3. The clock circuit as recited in claim 2, wherein the programmable delay includes:

a first programmable delay, coupled between the clock source and the first clock tree, for correcting a clock skew occurring in the control block in view of the overall clock skew;

a second programmable delay, coupled between the clock source and the second clock tree, for correcting a clock skew occurring in the macroblock in view of the overall clock skew; and a third programmable delay, coupled between the second clock tree and the macroblock, for correcting a delay occurring in the second clock tree and the macroblock.

4. The clock circuit as recited in claim 3, the third programmable delay includes a plurality of programmable delays, each coupled between the second clock tree and a corresponding macro.

5. The clock circuit as recited in claim 4, wherein each of the programmable delays includes a multiplicity of buffers coupled in a series fashion, wherein each buffer has a unit delay.

6. The clock circuit as recited in claim 5, wherein, when a greatest clock delay of the control block is greater than a greatest clock delay of the macroblock, a delay of the first programmable delay is "0" and a delay of the second programmable delay is N times of the unit delay, wherein N is an integer and is determined by satisfying the condition that a maximum delay of the clock circuit is greater than or identical to a delay obtained by adding N times of the unit delay to the greatest delay of the macroblock and is smaller than a delay obtained by adding (N+1) times of the unit delay to the greatest delay of the macroblock; and a delay of the third programmable delay is Ni times of the unit delay, wherein Ni is an integer and is determined by satisfying the condition that the maximum delay of the clock circuit is greater than or identical to a delay obtained by adding Ni times of the unit delay and a delay of the second programmable delay to an internal delay of the macro and is smaller than a delay obtained by adding (Ni+1) times of the unit delay and the delay of the second programmable delay to the internal delay of the macro.

7. The clock circuit as recited in claim 5, wherein, when a greatest clock delay of the control block is smaller than a greatest clock delay of the macroblock, a delay of the first programmable delay is N times of the unit delay, wherein N is an integer and is determined by satisfying the condition that the greatest clock delay of the macroblock is greater than a delay obtained by adding (N−1) times of the unit delay to the greatest delay of the control block and is smaller than or identical to a delay obtained by adding N times of the unit delay to the greatest delay of the control block; a maximum delay of the clock circuit is a delay obtained by adding N times of the unit delay to the greatest delay of the control block; a delay of the second programmable delay is "0"; and a delay of the third programmable delay is Ni times of the unit delay, wherein Ni is an integer and is determined by satisfying the condition that the maximum delay of the clock circuit is greater than or identical to a delay obtained by adding Ni times of the unit delay to an internal delay of the macro and is smaller than a delay obtained by adding (Ni+1) times of the unit delay to the internal delay of the macro.

8. a semiconductor device having a control block and a macroblock, wherein the control block has a number of latches and the macroblock has a plurality of macros, comprising:

a clock source for generating the clocks;

a clock tree, coupled between the clock source and the control block and the macroblock, for relaying the clocks to the control block and the macrobock; and programmable delays coupled between the clock source and the clock tree and between the clock tree and the control block and the macroblock in order to reduce overall clock skew.

9. The semiconductor device as recited in claim 8, wherein the clock tree includes:

a first clock tree coupled between the clock source and the control block; and a second clock tree coupled between the clock source and the macroblock.

10. The semiconductor device as recited in claim 9, wherein the programmable delay includes:
- a first programmable delay, coupled between the clock source and the first clock tree, for correcting a clock skew occurring in the control block in view of the overall clock skew;
- a second programmable delay, coupled between the clock source and the second clock tree, for correcting a clock skew occurring in the macroblock in view of the overall clock skew; and
- a third programmable delay, coupled between the second clock tree and the macroblock, for correcting a delay occurring in the second clock tree and the macroblock.

11. The semiconductor device as recited in claim 10, the third programmable delay includes a plurality of programmable delays, each coupled between the second clock tree and a corresponding macro.

12. The semiconductor device as recited in claim 11, wherein each of the programmable delay includes a multiplicity of buffers coupled in a series fashion, wherein each buffer has a unit delay.

13. The semiconductor device as recited in claim 12, wherein, when a greatest clock delay of the control block is greater than a greatest clock delay of the microblock, a delay of the first programmable delay is "0" and a delay of the second programmable delay is N times of the unit delay, wherein N is an integer and is determined by satisfying the condition that a maximum delay of the clock circuit is greater than or identical to a delay obtained by adding N times of the unit delay to the greatest delay of the macroblock and is smaller than a delay obtained by adding (N+1) times of the unit delay to the greatest delay of the macroblock; and a delay of the third programmable delay is Ni times of the unit delay, wherein Ni is an integer and is determined by satisfying the condition that the maximum delay of the clock circuit is greater than or identical to a delay obtained by adding Ni times of the unit delay and a delay of the second programmable delay to an internal delay of the macro and is smaller than a delay obtained by adding (Ni+1) times of the unit delay and the delay of the second programmable delay to the internal delay of the macro.

14. The semiconductor device as recited in claim 12, wherein, when a greatest clock delay of the control block is smaller than a greatest clock delay of the macroblock, a delay of the first programmable delay is N times of the unit delay, wherein N is an integer and is determined by satisfying the condition that the greatest clock delay of the macroblock is greater than a delay obtained by adding (N−1) times of the unit delay to the greatest delay of the control block and is smaller than or identical to a delay obtained by adding N times of the unit delay to the greatest delay of the control block; a maximum delay of the clock circuit is a delay obtained by adding N times of the unit delay to the greatest delay of the control block; a delay of the second programmable delay is "0"; and a delay of the third programmable delay is Ni times of the unit delay, wherein Ni is an integer and is determined by satisfying the condition that the maximum delay of the clock circuit is greater than or identical to a delay obtained by adding Ni times of the unit delay to an internal delay of the macro and is smaller than a delay obtained by adding (Ni+1) times of the unit delay to the internal delay of the macro.

* * * * *